United States Patent
Niewczas et al.

(10) Patent No.: US 7,469,078 B2
(45) Date of Patent: Dec. 23, 2008

(54) SYSTEM FOR REMOTE MEASUREMENTS

(75) Inventors: Pawel Niewczas, Glasgow (GB); James Rufus McDonald, Chapeltoun (GB)

(73) Assignee: University of Strathclyde, Glasgow (GB)

( * ) Notice: Subject to any disclaimer, the term of this patent is extended or adjusted under 35 U.S.C. 154(b) by 0 days.

(21) Appl. No.: 10/572,131

(22) PCT Filed: Sep. 20, 2004

(86) PCT No.: PCT/GB2004/004018

§ 371 (c)(1),
(2), (4) Date: Jul. 17, 2007

(87) PCT Pub. No.: WO2005/029005

PCT Pub. Date: Mar. 31, 2005

(65) Prior Publication Data

US 2008/0124020 A1    May 29, 2008

(30) Foreign Application Priority Data

Sep. 18, 2003  (GB) ................................ 0321804.7

(51) Int. Cl.
*G02B 6/00* (2006.01)
(52) U.S. Cl. ............................. 385/13; 385/12; 385/15; 385/31; 385/37
(58) Field of Classification Search ................... 385/12, 385/13, 15, 31, 37
See application file for complete search history.

(56) References Cited

U.S. PATENT DOCUMENTS

| | | | |
|---|---|---|---|
| 5,053,693 A * | 10/1991 | Bohnert et al. ................. | 324/96 |
| 5,336,883 A | 8/1994 | Hobby et al. | |
| 5,493,390 A | 2/1996 | Varasi et al. | |
| 5,945,667 A * | 8/1999 | Bohnert et al. ......... | 250/227.14 |
| 6,233,746 B1 | 5/2001 | Skinner | |
| 2002/0028034 A1 | 3/2002 | Chen et al. | |
| 2002/0182589 A1 | 12/2002 | Knudsen et al. | |

FOREIGN PATENT DOCUMENTS

| | | |
|---|---|---|
| DE | 199 02 279 A1 | 1/1999 |
| EP | 0 357 253 A | 3/1990 |
| GB | 2 255 635 A | 11/1992 |

OTHER PUBLICATIONS

Rao, Yun-Jiang, "In-fibre Bragg grating sensors", Meas. Sci. Tech. 8 (1997) pp. 355-375.

Kersey, D., "Interrogation and Multiplexing Techniques for Fiber Bragg Grating Strain-Sensors", SPIE vol. 2071, pp. 30-48, unknown date.

(Continued)

*Primary Examiner*—Jennifer Doan
(74) *Attorney, Agent, or Firm*—Alston & Bird LLP

(57) ABSTRACT

A system for measuring simultaneously both temperature and ac voltage and/or ac current, the system comprising: a piezo-electric sensor; and optical fiber that includes an optical strain sensor being in contact with the piezo-electric sensor and able to expand or contract therewith and an analyzer for analyzing an optical output of the fiber and strain sensor in response to an optical input, the analyzer being operable to use the optical output to determine the temperature and the ac voltage and/or ac current.

9 Claims, 3 Drawing Sheets

OTHER PUBLICATIONS

Niewczas, et al., "Interrogation of Extrinsic Fabry-Perot Interferometric Sensors Using Arrayed Waveguide Grating Devices", IEEE Transactions on Instrumentation and Measurement, vol. 52, No. 4, Aug. 2003, pp. 1092-1096.

Xiangyang, et al., "Theoretical and Experimental Study on the Fabrication of Double Fiber Bragg Gratings", Optical Fiber Technology 3, Article No. OF970210, (1997), pp. 189-193.

International Search Report, mailed Apr. 2, 2005.

* cited by examiner

SYSTEM FOR REMOTE MEASUREMENTS

BACKGROUND OF THE INVENTION

1. Field of the Invention

The present invention relates to a remote condition monitoring system for monitoring electrical equipment, such as an electric submersible pump (ESP) motor, in for example a downwell or sub-sea environment.

2. Description of Related Art

Systems for monitoring the performance of downhole production or sub-sea equipment would be very useful. Such monitoring systems could extend the lifetime of downhole production equipment, such as ESP motors, by ensuring that their operating parameters stay within safe limits. Unfortunately, there are no systems currently available that are suitable for monitoring the operation of downhole ESP motors. However, some downhole systems do include temperature and pressure sensors, typically based on fibre Bragg grating technology, for monitoring changes in the downwell environment. Because the most common reasons for ESP failures are the poor power factor operation or inadequate start-up procedures leading to significant overheating of the motor windings, it would be desirable to extend downwell monitoring capability to measuring voltage and current on the ESP motor terminals. This would allow a faster response to off-optimal operating conditions of the motor, thereby reducing the cumulative duration of electrical, thermal and mechanical stress on the motor.

Whilst numerous voltage and current sensors are known, many are not suitable for use downwell, primarily because of the extreme conditions of temperature and pressure and the need to send signals over large distances from the downwell equipment to surface stations. This is becoming a more significant problem because as the main offshore reservoirs become depleted, operators are increasingly considering the exploitation of satellite fields within the vicinity using subsea ESPs at large step-out distances in the region of or even in excess of 30 km.

The projected use of higher rating ESPs over longer distances has presented designers with a number of potential problems that do not exist to the same degree with schemes in current use. These problems relate to the possibility of cable overvoltage conditions in certain circumstances, the operation of the system at higher nominal voltages and potentially costly maintenance due to the retrieval and replacement of the ESP and lost productivity. It is for these reasons that improved methods of control and the introduction of novel monitoring techniques, tailored to the industry's needs are seen as a necessary enhancement for future ESP schemes.

BRIEF SUMMARY OF THE INVENTION

An object of the present invention is to provide a measurement system capable of monitoring the performance of ESP motors in adverse electrical, mechanical and thermal conditions, such as exist in a downwell environment.

According to one aspect of the present invention there is provided a system for measuring simultaneously both temperature and ac voltage and/or ac current, the system comprising: a piezoelectric sensor; an optical fibre that includes an optical strain sensor, the sensor being in contact with the piezoelectric sensor and able to expand or contract therewith and an analyser for analysing an optical output of the fibre and strain sensor in response to an optical input, the analyser being operable to use the optical output to determine the temperature and the ac voltage and/or ac current.

By combining an optical strain sensor and a piezoelectric sensor, there is provided a mechanism for the simultaneous measurement of voltage and temperature at a remote location. Hence by connecting, for example, the windings of an ESP motor across the piezo-electric element, the ac voltage drop across these can be monitored, simultaneously with temperature. Because an optical signal is being used to sense the ac voltage and temperature, it can be transmitted over large lengths of optical fibre without significant deterioration. This means that signals detected in the extreme downwell environment can be successfully transmitted to remote monitoring surface stations.

The optical strain sensor may be a fibre Bragg grating. Fibre Bragg gratings are written in a core of an optical fibre (usually singlemode) using standard writing technologies, and can be manufactured for operation at telecommunications wavelengths, e.g. 1550 mm window. This gives the benefit of the lowest attenuation of an optical addressing fibre, allowing large step-out remote interrogation systems to be readily developed. In addition, Type II gratings or chemical composition gratings (CCGs) have been shown to withstand temperatures in excess of 800° C., and with appropriate coatings, e.g. polyamide, can operate continuously up to 300-400° C.

More than one fibre Bragg grating is provided along the fibre. Two fibre Bragg gratings may be provided in the same length of fibre. Alternatively, the optical strain sensor could comprise a Fabry-Perot interferometric sensor or a Mach-Zehnder interferometer.

The instantaneous spectral position of a reflection peak associated with the optical strain sensor is indicative of a measure of an ac voltage applied to the piezo-electric element and the average or low pass filtered spectral position of the strain sensor reflection peak is indicative of temperature readings. To this end, the system analyser is configured to determine the ac voltage applied to the piezo-electric element using the instantaneous spectral position of a reflection peak and the temperature using the average or low pass filtered spectral position of the reflection peak.

According to another aspect of the invention, there is provided a sensor for measuring simultaneously temperature and ac voltage or current and dc voltage, the sensor comprising: a piezo-electric element and an optical fibre that includes a first optical strain sensor, preferably a Bragg grating, the optical strain sensor being in contact with the piezo-electric sensor and able to expand or contract therewith and a second optical strain sensor, preferably a second Bragg grating, that is thermally coupled to the element, but mechanically decoupled. Preferably, the optical fibre makes two or more passes through the piezo-electric element. By doing this, the size of the sensor can be minimised, whilst optimising the functionality. This is advantageous in the down-well environment where space is very limited. The voltage may be ac and/or dc voltage.

Preferably, the sensor includes means for connecting the optical fibre to a remote system. Preferably, the remote system includes an analyser or processor for analysing an optical output of the fibre in response to an optical input. Preferably, the analyser or processor is operable to use the optical output to determine the temperature and the ac voltage that is developed across the part of the electrical equipment that is connected across the Bragg grating and/or current when an additional current-to-voltage transducer is applied.

According to yet another aspect of the present invention, there is provided a down-well tool that includes electrical equipment, for example a motor, part of the electrical equipment, for example one or more windings of the motor, being connected across a piezo-electric sensor, the tool further comprising an optical fibre that includes an optical strain sensor, preferably a Bragg grating, the optical strain sensor being in contact with the piezo-electric sensor and able to expand or contract therewith and means for connecting the optical fibre to a remote system. Preferably, the remote system includes an analyser or processor for analysing an optical output of the fibre in response to an optical input. Preferably, the analyser or processor is operable to use the optical output to determine the temperature and the ac voltage that is developed across the part of the electrical equipment that is connected across the Bragg grating and/or current when an additional current-to-voltage transducer is applied.

BRIEF DESCRIPTION OF THE SEVERAL VIEWS OF THE DRAWINGS(S)

Various aspects of the invention will now be described by way of example only with reference to the accompanying drawings, of which:

DETAILED DESCRIPTION OF THE INVENTION

Figure 1:
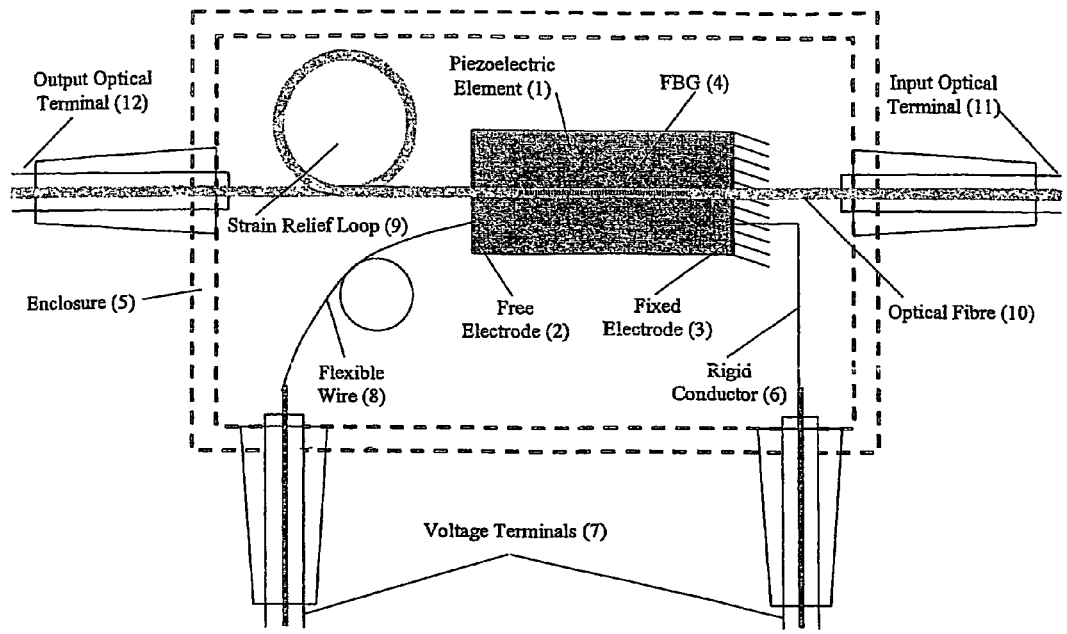
FIG. 1 is a block diagram of a first downwell monitoring system.

FIG. 1 shows an enclosure or housing 5 that includes a piezo-electric element 1 in the form of a parallelepiped or a rod with electrodes 2, 3 deposited on opposing end surfaces. The piezo-electric element 1 acts as a primary transducer to convert voltage applied to the electrodes into strain within the element. Attached to or embedded within this element 1, either perpendicular (as shown in FIG. 1) or parallel to the electrodes 2, 3, is an optical fibre that includes a single Bragg grating (FBG) 4. This grating 4 is used to measure voltage-induced strain in the element and responds to temperature changes caused by both the thermal expansion/contraction of the transducer and thermally induced changes in the FBG refractive index modulation. A sensor of this general type is described in DE 199 02 279 A.

Provided along the optical fibre 10 is a strain relief loop 9 or other means of strain relief for de-coupling any strain caused by the expansion/contraction of the piezo-electric element 1 and/or the enclosure 5. The fibre 10 extends through optical terminals 11, 12 on opposing walls of the enclosure 5, which optical terminals can be realised in the form of optical pigtails with cable glands or optical connectors. Connected to the remote ends of the fibre is a spectral analyser (not shown) for providing a spectral response thereof in response to a known optical input. Typically, this would be provided at a surface station remote from the downwell environment.

One of the electrodes 3 is fixed to the enclosure 5 of the apparatus and the second electrode 2 has unrestricted movement. This can be realised by attaching a rigid conductor 6 to the enclosure 5 and soldering it or otherwise attaching to the fixed electrode 3 such that the rigid conductor 6 supports the transducer 1 and provides an electrical connection to one of a pair of voltage terminals 7. The electrical connection to the free electrode 2 can be realised using a flexible wire 8, thus ensuring that the movement of the free electrode 2 is unrestricted. This is connected to the other of the voltage terminals 7. The voltage terminals 7 of the apparatus may comprise any appropriate high voltage cables and glands. Connected to these voltage terminals would be, for example, the windings of an ESP motor. In this way, any voltage developed across the windings would be applied across the piezo-electric element 1.

In use, light is injected into the fibre 10 and the spectral response is measured. Any suitable light source could be used, although a specific example is a broadband light source. The spectrum reflected from the Bragg grating 4 can be analysed using a fast optical spectrum analyser and subsequently processed digitally to recover the voltage and temperature parameters. Ideally, the interrogation process should be fast enough to acquire voltage data at a frequency of at least twice of that of the voltage signal. Several techniques of interrogating spectrally encoded sensors in an automatic fashion are known in the art, see for example the article "In Fibre Bragg grating sensors", by Rao, Meas. Sc. Tech. 8 (1997) 355-375; "Interrogation and multiplexing techniques for fiber Bragg grating strain sensors" by D. Kersey, SPIE Vol. 2071 30-48, and P. Niewczas at al, IEEE T on Instrumentation and Measurement, 52 (4): 1092-1096 August 2003. The apparatus of FIG. 1 can be interrogated employing any of these known techniques.

Figure 2:
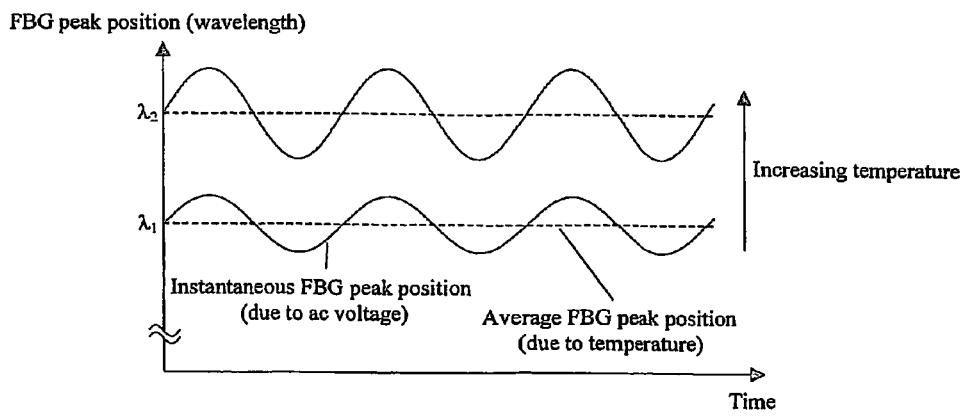
FIG. 2 shows a peak position response of the monitoring system of FIG. 1 to ac voltage modulation at two different temperatures.

To recover voltage and temperature parameters, the spectral analyser of the apparatus of FIG. 1 includes software for analysing the spectra captured. This is operable to use the detected instantaneous and average or low pass filtered FBG peak positions as well as calibration information to determine the temperature and the voltage. The instantaneous spectral position of the FBG 4 reflection peak can be calibrated in terms of ac voltage readings. The average spectral position of the FBG reflection peak can be calibrated in terms of temperature readings. Thus, by capturing optical spectra from a single optical strain sensor 4, combined ac voltage and temperature data can be obtained. As an example, FIG. 2 shows a FBG spectral position in time domain at two different temperatures when ac voltage is applied to the sensor terminals. It can be seen that the instantaneous peak position follows the applied ac voltage and the average peak position follows the changes in temperature. FIG. 2 also shows that as the temperature increases, the amplitude of instantaneous peak position due to ac voltage increases.

In order to calibrate the sensor for temperature and voltage, a temperature cycle is first applied to the sensor over its operating temperature range and the average wavelength recorded for every temperature point. This allows a look-up table to be built or for the construction of a best-fit function which can then be used to find the local temperature during measurement on the basis of the known average FBG peak position. The amplitude of the instantaneous peak position at the given sinusoidal input voltage can also be recorded during the temperature cycling, and a second look-up table or a best fit function can be created that would reflect the sensor sensitivity changes versus temperature. Consequently, during operation, the derived temperature readings can be used to correct the voltage readings which are affected by the temperature variations and require compensation if the sensor is to operate over the extended temperature range.

The system of FIG. 1 allows for the simultaneous measurement of ac voltage and temperature. For many downwell applications where only ac signals are present this is useful information. In some circumstances, however, ac and dc voltage will be present and it would be useful to have a measure of both of these. To this end, optionally, in the system of FIG.

1 a plurality of FBGs, for example two, may be written in the same length of the fibre, instead of just one FBG 4. This allows for simultaneous measurement of strain and temperature within the piezo-electric element, provided that the two FBGs have different responses to strain and temperature changes. This allows ac and dc voltage and temperature to be measured. In this case the two FBGs would produce two different wavelength shifts when strained due to voltage and/or subjected to thermal influence. This information combined with the known response characteristics to voltage and temperature of the two FBGs is sufficient to create a set of two equations with two unknowns, i.e., voltage (instantaneous value) and temperature, for which the solution must be found in real time. The voltage and temperature response characteristics can be obtained by simultaneous temperature and voltage cycling of the sensor and recording a set of data points for each temperature and voltage value. Such arrangements of two FBGs written in one fibre location are known in prior art in applications requiring both strain and temperature measurement, see for example "Theoretical and experimental study on the fabrication of double fiber Bragg gratings" by X. Y. Wang et al, OPT FIBER TECHNOL 3 (2): 189-193 April 1997.

Figure 3:
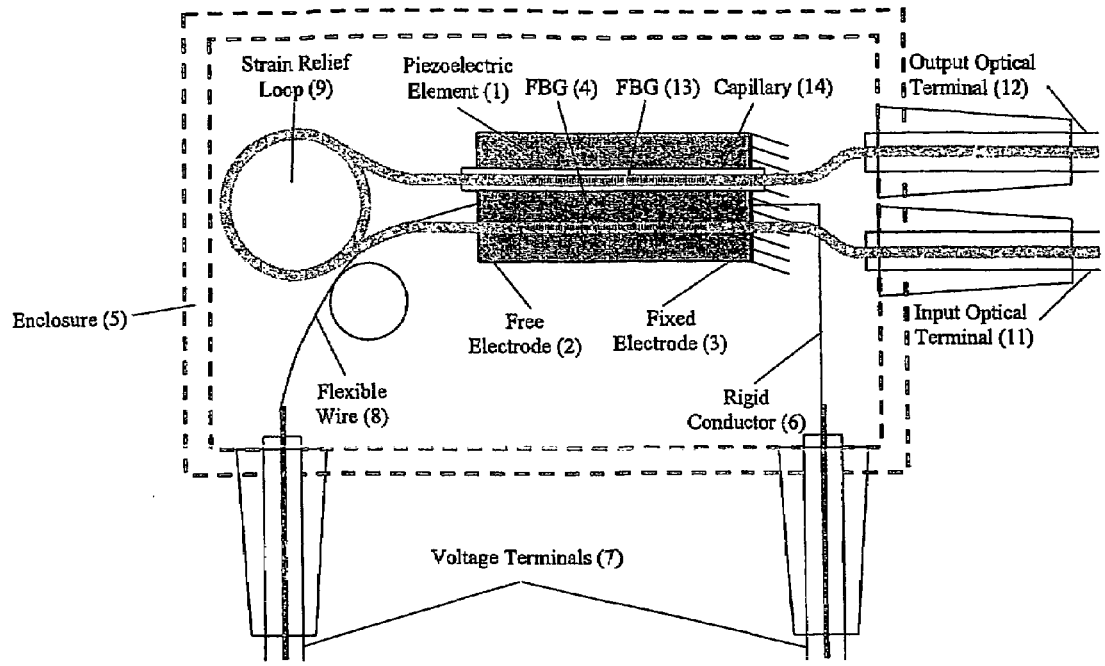
FIG. 3 is a block diagram of a second downwell monitoring system.

FIG. 3 shows another down-well measurement system. This is similar to that of FIG. 1, except in this case, the optical fibre includes two Bragg gratings, FGB 4 and FBG 13, and makes two passes through the piezo-electric element 1. As before, the first Bragg grating is embedded within the element 1 so that it can expand and contract therewith. In contrast, the additional FBG 13 is coupled thermally to the apparatus, but is de-coupled from strain changes. This can be realised using for example a capillary 14 attached to or embedded in the apparatus into which the second FBG 13 is inserted. This additional fibre Bragg grating FBG 13 is provided to measure the local temperature to compensate for thermal drift of the voltage measurement. This allows both ac and dc voltage and temperature to be measured simultaneously. This can be realised in the same way as for the case of a double FBG. The two wavelength responses would be produced by the two FBGs. One dependent on the number of parameters, i.e., strain due to voltage, strain due to temperature and FBG internal temperature effect. The other wavelength response, produced by the FBG de-coupled from strain, would only be dependent on the local temperature. This wavelength change information combined with the two FBG characteristics (one dependent on voltage and temperature and the other dependent on temperature only) can be used to create a set of two equations with voltage and temperature as the two unknowns. This set of equations must be solved in real time to recover the measured parameters. Again, the characteristics for the construction of the set of the two equations can be obtained by simultaneous temperature and voltage cycling of the sensor and by recording wavelengths shifts of the two FBGs for every temperature and voltage point.

Figure 4:
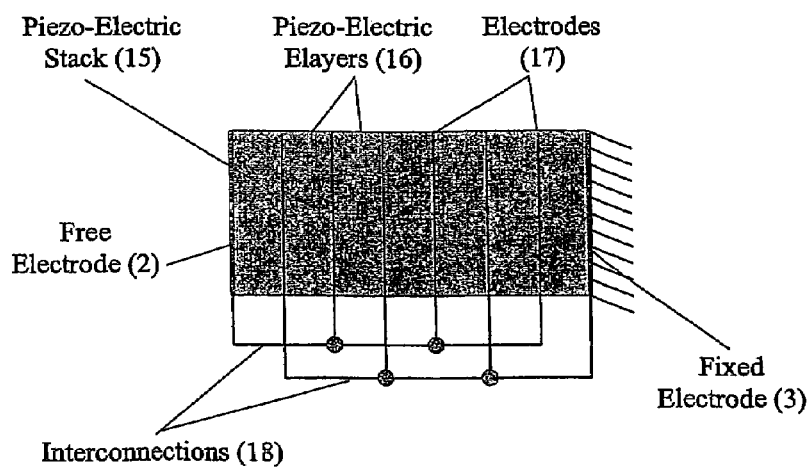
FIG. 4 is a cross section through a piezo-electric stack that could be used in the systems of FIG. 1 or 3.

In order to increase the voltage measurement sensitivity of the present apparatus, the primary transducer in the form of a piezo-electric element 1 may be replaced with a modified primary transducer in the form of a piezo-electric stack 15, as shown in FIG. 4. The piezo-electric stack 15 is made of piezo-electric layers 16, separated by electrodes 17. The individual piezo-electric layers 16 are arranged in the stack so that consecutive layers have inverted polarities in order to facilitate parallel electrical connections between same polarity electrodes. These are then interconnected and connected to the external electrodes, i.e. free electrode 2 and fixed electrode 3 as shown in FIG. 4. The individual layers are attached to each other using methods known in the prior art of making piezo-electric stacks. Such an arrangement enables greater electric fields to be induced within the piezo-electric material in comparison with the single element arrangement. Hence, the sensitivity of voltage-to-strain response can be increased and tailored to the specific application or voltage rating by changing the number and thickness of individual layers. The electrodes between the individual piezoelectric layers in the stack are preferably made as thin as possible in order to reduce the effect of non-uniform straining of the FBG. Non-uniform straining would produce a slightly wider FBG spectral response and a slightly lower wavelength shift when voltage is applied. However, this effect would not have any serious detrimental repercussion on the sensor operation as the transducer would be calibrated prior to its use.

Figure 5:
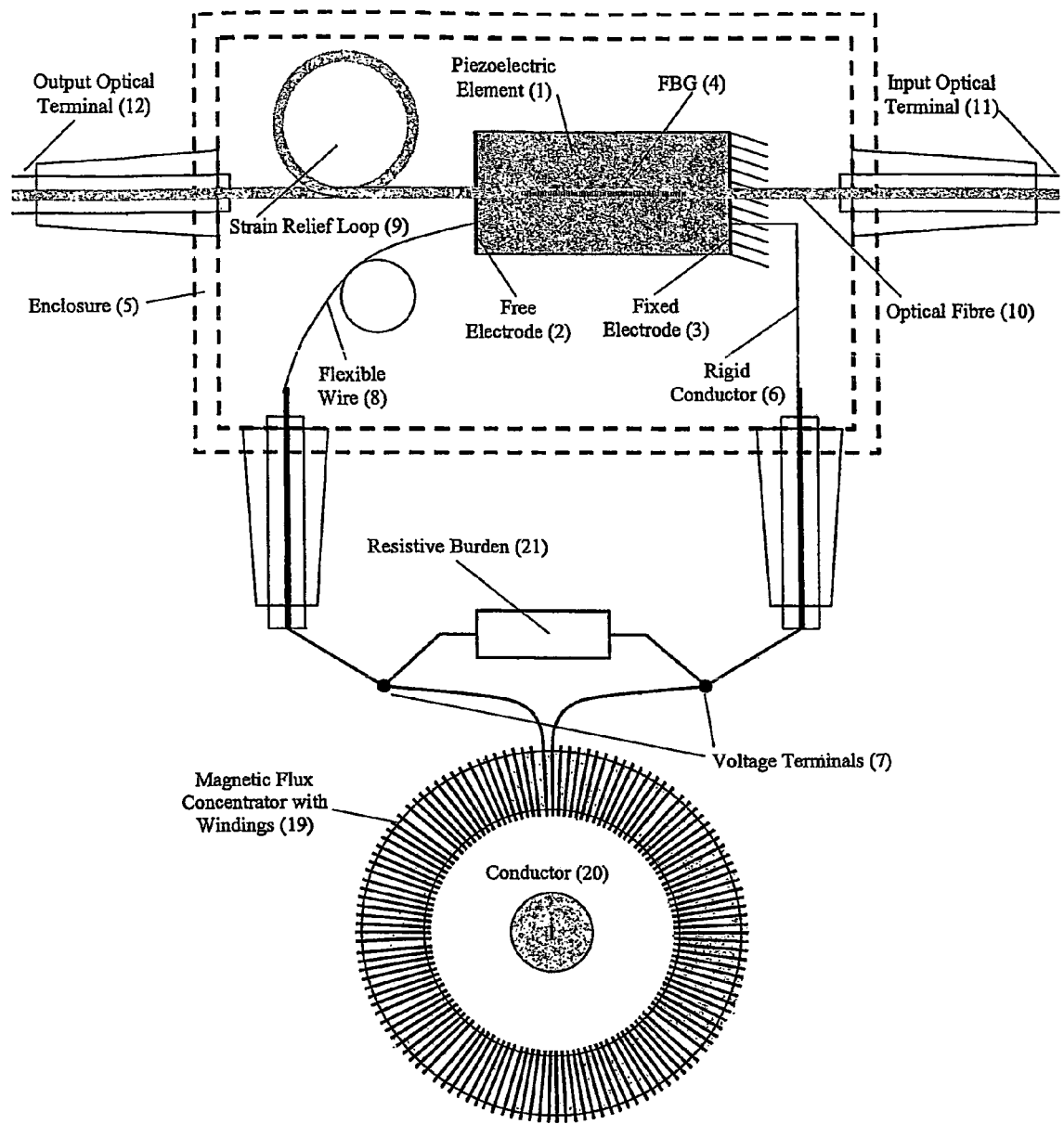
FIG. 5 is a block diagram showing an optional modification to the systems of FIG. 1 or FIG. 3.

With reference to FIG. 5, the apparatus of FIGS. 1 and 3 can be used to measure current when operating together with an appropriate magnetic flux concentrator with windings 19. The terminals of the secondary windings would be connected to a resistive burden 21 and the input terminals 7 of the voltage sensor. The flux concentrator 19 surrounds the current carrying conductor 20, for example a cable or winding of the ESP motor, and converts the current into voltage, which is measured across the resistor terminals by the voltage sensor. The ac voltage and temperature can be determined as described previously with reference to FIG. 1. A measure of the current can be then recovered by appropriately scaling this measured voltage within the spectral analyser or a processing unit associated therewith. It should be noted that only ac currents can be measured using this arrangement.

The present invention allows for the remote measurement of voltage, temperature and, optionally current in adverse electrical, mechanical and thermal conditions. The apparatus has an excellent multiplexing capability, i.e. several similar devices and/or other spectrally encoded sensors can be addressed using a single optical fibre cable. In addition, the present apparatus can be made into a compact device, which allows for mounting in confined spaces.

A skilled person will appreciate that variations of the disclosed arrangements are possible without departing from the invention. For example whilst the invention has been described primarily with reference to down-well or sub-sea applications, it will be appreciated that it could be used in any remote condition-monitoring environment. Accordingly the above description of the specific embodiment is made by way of example only and not for the purposes of limitation. It will be clear to the skilled person that minor modifications may be made without significant changes to the operation described.

The invention claimed is:

1. A system for measuring simultaneously both temperature and ac voltage comprising:
   a piezo-electric sensor;
   an optical fiber that includes an optical strain sensor, the sensor being in contact with the piezo-electric sensor and able to expand or contract therewith; and
   an analyzer for analyzing an optical output of the fiber and strain sensor in response to an optical input,
   wherein the analyzer is configured to determine ac voltage applied to the piezo-electric element by comparing the instantaneous spectral position of a reflection peak with calibration data and to determine temperature by comparing the average or low pass filtered spectral position of a reflection peak with calibration data.

2. A system as claimed in claim 1 wherein the optical strain sensor comprises one or more fiber Bragg gratings and/or Fabry-Perot interferometric sensors and/or Mach-Zehnder interferometers.

3. A system as claimed in claim 1 wherein the piezo-electric element is a piezo-electric stack.

4. A system as claimed in claim 1 wherein a current transformer is provided for converting an ac current to an ac voltage for applying to the piezo-electric sensor, wherein the analyzer is operable to determine the ac voltage and convert it to a measure of the ac current applied to the transformer.

5. A system as claimed in claim 1 wherein the optical fiber includes a second optical strain sensor that is contact with the piezo-electric sensor and able to expand or contract therewith, but has different strain and temperature responses from the other optical sensor, so that the optical outputs of the two sensors are different, wherein the analyzer is operable to use the optical responses from each sensor and pre-determined response data to determine the temperature, ac voltage and dc voltage.

6. A system as claimed in claim 1 wherein the optical fiber includes a second optical strain sensor that is thermally coupled to the piezo-electric element, but mechanically decoupled, so that the optical outputs of the two sensors are different, wherein the analyzer is operable to use the optical responses from each sensor and pre-determined response data to determine the temperature, ac voltage and dc voltage.

7. A system as claimed in claim 5 wherein the optical fiber makes two or more passes through the piezo-electric element.

8. A terrestrial, sub-sea or down-well tool that includes electrical equipment, a part of the electrical equipment, being connected across a piezo-electric sensor, the tool further comprising an optical fiber that includes an optical strain sensor in contact with the piezo-electric sensor and able to expand or contract therewith and means for connecting the optical fiber to a remote analyzer for analyzing an optical output of the fiber in response to an optical input, wherein the analyzer is operable to determine the ac voltage applied to the piezo-electric element by comparing the instantaneous spectral position of a reflection peak with calibration data and to determine the temperature by comparing the average or low pass filtered spectral position of a reflection peak with calibration data.

9. A terrestrial, sub-sea or down-well tool as claimed in claim 8 wherein a current transformer is provided for converting an ac current to an ac voltage for applying to the piezo-electric sensor, wherein the analyzer is operable to convert the ac voltage determined to a measure of the ac current applied to the transformer.

* * * * *